United States Patent [19]

Hill

[11] 4,306,145
[45] Dec. 15, 1981

[54] HIGH STABILITY NO FEEDBACK OPTICAL TRANSISTOR AMPLIFIER SYSTEM

[75] Inventor: Roy K. Hill, Bristol, Va.

[73] Assignee: Sperry Corporation, New York, N.Y.

[21] Appl. No.: 107,969

[22] Filed: Dec. 28, 1979

[51] Int. Cl.³ .......................... H03F 17/00; H03F 3/08
[52] U.S. Cl. ............................... 250/214 A; 307/311; 330/59; 330/308
[58] Field of Search ...................... 250/214 A, 214 R; 307/311; 330/59, 308

[56] References Cited

U.S. PATENT DOCUMENTS

| 3,333,106 | 7/1967 | Fischer | 250/214 A X |
| 3,474,251 | 10/1969 | Milford | 307/311 |
| 3,576,452 | 4/1971 | Smith | 307/311 |

OTHER PUBLICATIONS

R. L. Bright, "Junction Transistors Used as Switches," Mar. 1955, A.I.E.E. Transactions, vol. 74, No. 1, pp. 111-121.

Primary Examiner—David C. Nelms
Assistant Examiner—Edward P. Westin
Attorney, Agent, or Firm—John B. Sowell; William E. Cleaver; Marshall M. Truex

[57] ABSTRACT

The present invention comprises a low gain amplification circuit for amplifying the output of a light detecting transistor and producing a logic output strong enough to drive standard transistor logic circuitry. One or more bipolar non-symmetrical transistors are arranged in a cascade connected circuit to produce an amplification gain less than that of a single conventional transistor. The bipolar non-symmetrical transistors are reverse connected between the high level and low levels of the power supply and all feedback lines are eliminated while the frequency response is substantially increased.

6 Claims, 5 Drawing Figures

HIGH STABILITY NO FEEDBACK OPTICAL TRANSISTOR AMPLIFIER SYSTEM

BACKGROUND OF THE INVENTION

1. Field of the Invention

The present invention is related to transistor amplifiers having low gain and high frequency response or band width. The amplifiers produce a matching transitional voltage level characteristic for a family of transistors.

2. Description of the Prior Art

Prior Art amplifiers are known which are capable of achieving high gain amplification with low band width. To achieve higher frequency response or band width with such devices, feedback circuits have been employed. Aside from the extra components required to construct feedback circuits, such feedback circuits also produce signal phase shift which requires additional compensating circuits. Each element added in a feedback or compensating circuit also adds additional noise. When very high gain amplification devices are employed the devices create inherent d.c. problems which usually require adjustable or compensating circuits.

Amplifiers for optical transistors may be generally classified into three types for purposes of this explanation, namely (1) Discrete transistor amplifiers, (2) Operational amplifiers and (3) Darlington pairs of connected transistors.

Discrete transistor amplifiers are not available with gain characteristics below a factor of 20 to 1, accordingly, it is impossible to employ a discrete transistor amplifier between a photo transistor and a logic driver without employing feedback circuits which will reduce the gain.

Operational amplifiers are commercially available, however, such amplifiers have gain ratios in excess of those found in discrete transistor amplifiers. The usual amplification gain for operational amplifiers may vary from a low of around 400 to 1 to in excess of 100,000 to 1. Operational amplifiers require feedback circuitry to reduce the very high gain and in addition require some form of phase shift compensation to prevent oscillation. Most operational amplifiers generate an inherent d.c. level and require additional compensation elements to eliminate the d.c. offset.

Transistor amplifiers in Darlington Pair configurations have gain ratios in excess of the gain ratios achieved by discrete transistor amplifiers. Darlington Pair amplifiers are inherently slow because they have inherently high impedence characteristics. Darlington Pair amplifiers are slower yet when the first stage is a photo transistor and comprises part of the Darlington Pair. It has been found that Darlington Pair amplifiers having high impedance have low frequency response and are not suitable for use with high speed computer peripheral devices. Darlington Pair amplifiers are known which have low impedance and such amplifiers have higher frequency response, however, such low impedence Darlington Pair amplifiers do not have high enough voltage output to be compatible for driving a transistorized logic output device without using other discrete stage amplification. While the Darlington Pair amplifier does not require feedback amplification to reduce its gain, the last stage of amplification may require feedback to produce a proper transitional level for compatibility with the logic output driver.

In addition, the Darlington Pair amplifier has its own unique problem. The lowest voltage drop across the output ($V_{ce}$) of a silicone transistor Darlington Pair is approximately 0.8 volts. A single stage bipolar transistor has an operational level below 0.4 volts, accordingly, such devices when connected to the output of a Darlington Pair configuration cannot be employed in computer logic circuits where dependability is a necessity. Stated differently, the voltage output, Vce of first stage plus the base to emitter voltage ($V_{be}$) of the second stage can be no lower than 0.8 volts, thus, it is the characteristic of the output of the second stage of a Darlington Pair amplifier to never be able to drop below 0.8 volts. It will be noted that the low voltage logic level for the input to a logic driver of the bipolar transistor type is specified as 0.8 volts. Accordingly, there is no more margin of operational assurance at the low level.

The greatest problem with the attempt to substitute fiber optic cables for coaxial cables has been the expense of the optical amplifying system and the compatible logic drivers.

The next greatest problem incurred in substituting fiber optic cables for coaxial cables has been the need to miniaturize the optical amplifying system and compatible logic drivers.

Another of the present limitations with being able to substitute fiber optic cables for coaxial cables is that the frequency response of the optical amplifying system is too low to permit use with high frequency response and wide band width systems.

SUMMARY OF THE INVENTION

It is the principal object of the present invention to provide a novel optical amplifier system which has high frequency response and yet requires fewer components than prior art optical amplifiers.

It is another principal object of the present invention to provide a novel optical amplifier system having a gain ratio less than 20 to 1 and which has an output transitional voltage level compatible with transistorized logic drivers.

It is another object of the present invention to provide a novel optical amplifier system which may be produced as a smaller physical size and is thus capable of being produced as an integrated circuit providing a plurality of optical amplifiers on the same chip.

It is yet another object of the present invention to provide a novel optical amplifier which draws less power than prior art optical amplifiers.

It is yet another object of the present invention to provide a novel optical amplifier which is cheaper to make, has fewer components and produces less noise than prior art amplifiers having the same gain ratio.

It is another object of the present invention to provide a novel optical amplifier which is more reliable and stable than prior art low gain ratio optical amplifiers.

It is another object of the present invention to provide a novel optical amplifier system which does not require feedback circuits, compensation for oscillation or d.c. offset levels.

According to these and other objects of the present invention to be discussed in greater detail hereinafter, there is provided an optical amplifier having low amplification and high frequency response which includes a photo transistor having its input coupled to a source of light signals. The output of the photo transistor is connected to the base of a bipolar non-symmetrical transistor which has its emittor electrode connected to a high voltage source of power and its collector electrode connected to the low voltage level of the power source so that the non-symmetrical transistor is reverse connected to the power source whereby the gain ratio is reduced below a factor of 20 to 1 and the frequency response is substantially increased thus permitting the output of the non-symmetrical transistor to drive directly a transistorized logic driver in the output of the system circuit.

BRIEF DESCRIPTION OF THE DRAWINGS

The foregoing objects and advantages of the novel optical amplifier system and its mode of operation will be made apparent from the detailed description of the accompanying drawings in which.

DESCRIPTION OF THE PREFERRED EMBODIMENT

Figure 1:
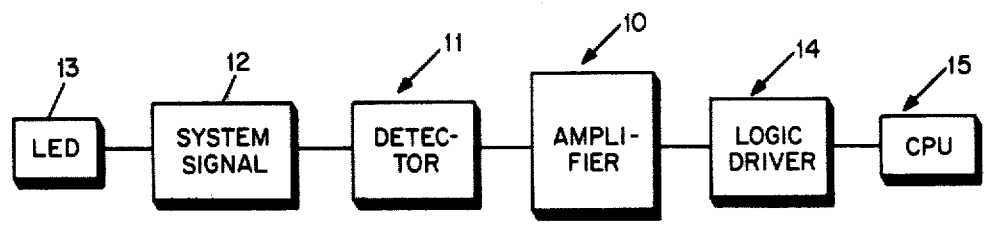
FIG. 1 is a block diagram of an optical amplifier system connected in a preferred embodiment environment.

Refer now to FIG. 1 showing the amplifier 10 in block diagram in a system environment. The amplifier 10 receives signals from detector 11 which were generated by a system signal device 12 cooperating with a light source such as an LED 13. The output of amplifier 10 is preferably employed to set and reset a logic driver 14 which reshapes the digital signals applied to CPU 15. It will be understood that this is a typical block diagram intended to show the environment in which the preferred embodiment invention amplifier may be used.

Figure 2:
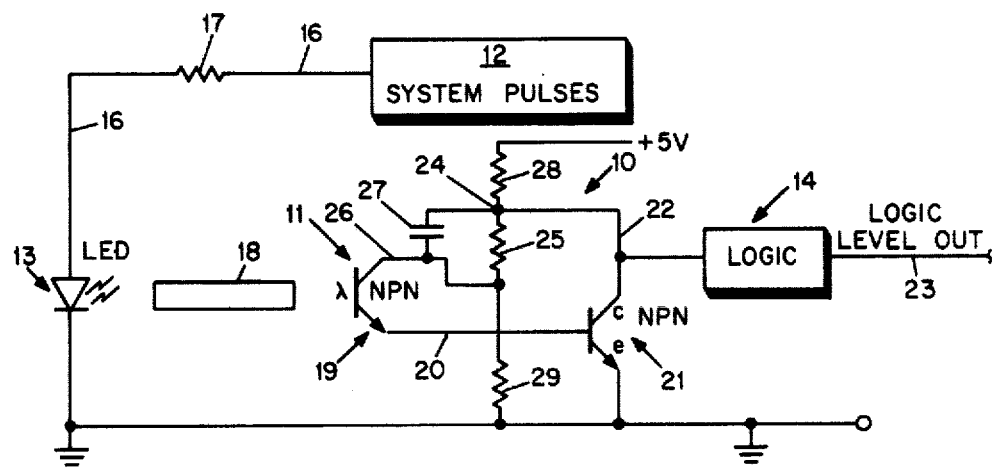
FIG. 2 is a schematic wiring diagram of a prior art discrete transistor amplifier.

FIG. 2 is a typical prior art amplifier 10 which requires feedback in order to reduce the gain so that the output signal may be employed to drive logic 14 at the proper transition level. The system pulse signals 12 are typical of signals which may be generated at a peripheral device and processed and applied to line 16 and conducted via limiting resistor 17 to LED 13. Positive signals on line 16 cause light emitting diode 13 to generate a light output which is conducted via transmission path 18 to the base of NPN photo transistor 19. Conduction of NPN photo transistor 19 generates an output on emitter output line 20 which is connected to base of NPN transistor 21. When transistor 21 conducts the output on collector line 22 drives logic 14 to generate a signal on output line 23. The gain of NPN transistor 21 is greater than 20 to 1 and may be as high as 1,000. Accordingly, the output on collector line 22 is connected at terminal 24 and forms a feedback line via feedback resistor 25 in the collector line 26. To prevent oscillation or to correct phase shift a capacitor 27 is included in parallel to feedback resistor 25. Load resistor 28 and a voltage divider 29 complete the feedback network. The transistor 21 may typically be a 2N5981 and when placed in the circuit embodiment of FIG. 2 would have a response time of no better than 10 microseconds. It will be understood that these values may be changed by changing the feedback gains but is generally representative of the values achieved in the prior art.

Figure 3:
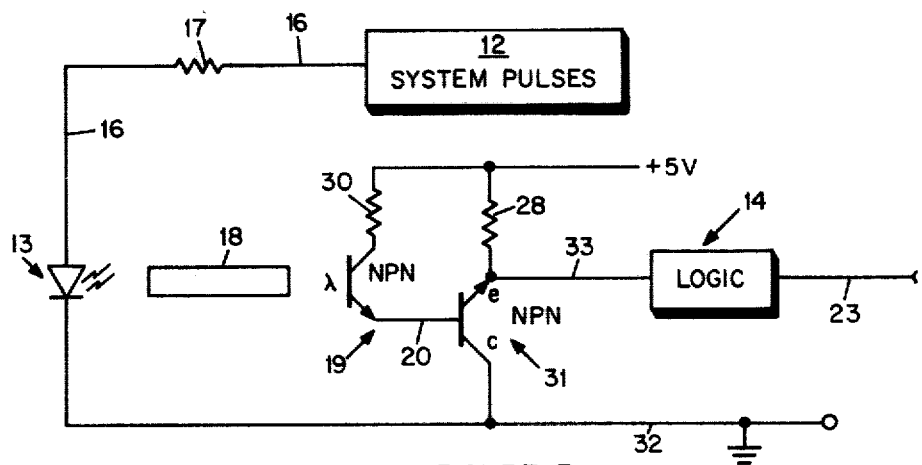
FIG. 3 is a schematic wiring diagram of a preferred embodiment optical amplifier according to the present invention.

Refer now to FIG. 3 showing the same input embodiment in which the system pulses 12 are applied to LED 13 via line 16 and resistor 17. The light signal from diode 13 is passed through transmission path 18 and applied to the base of NPN photo transistor 19 causing the photo transistor 19 to conduct through limiting resistor 30 and apply a signal on emitter line 20 to the base of NPN transistor 31 which is reverse connected between the five volt source and the reference or ground 32. The output signal on output line 33 to logic 14 preferably has a gain for the amplifier system of only five which makes the drive signal compatible with the logic block 14. By reverse connecting the NPN transistor 31 so that the emitter electrode is connected to the high or five volt source the normal gain of the 2N5981 type transistor is reduced from approximately 600 to approximately 5 and none of the feedback network circuits shown in the prior art FIG. 2 amplifier are required. It was discovered that not only was the gain characteristic compatible with the circuit requirements but the response time of transistor 31 was increased by a factor of approximately 10. By increasing the response time of the amplifier system of FIG. 3 not only are the number of components reduced but there are synergistic effects which enable the amplifier system to be used with fiber optic cables employed between the computers and high speed peripheral devices such as disk drives. It will be noted that the transistor 31 only requires a load resistor 28 which is easily manufactured into an integrated circuit form. Logic element 14 is typically a Schmitt trigger device which is available either in an inverting or noninverting type, thus, the polarity of the output of transistor 31 is not important. Accordingly, it will be understood that transistor 31 may be a PNP type transistor which is reverse connected between the five volt source and the reference 32.

It should be appreciated that bipolar non-symmetrical transistors are commercially available and the descriptive literature concerning these transistors only includes output curves for the high gain characteristics. There are no curves for output and frequency response for bipolar non-symmetrical transistors when connected in a reverse bias environment. It will be further appreciated that there are no bipolar non-symmetrical transistors for producing small signals which have gain ratios even approximating gains as small as 20 to 1.

Figure 4:
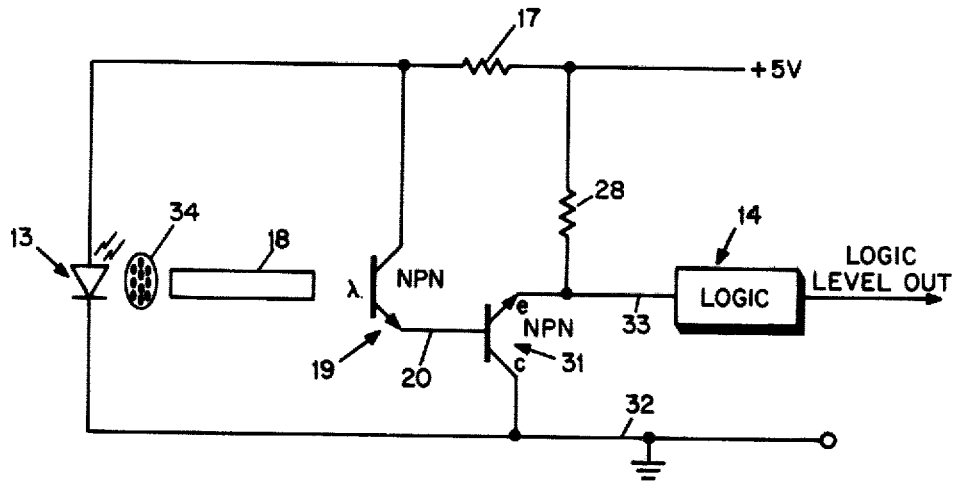
FIG. 4 is a schematic wiring diagram of a preferred embodiment optical amplifier similar to FIG. 3 but incorporating a signal interruptor between the light emitting diode and the transistorized photo detector.

Refer now to FIG. 4 which is similar to FIG. 3 but showing how a light interruptor may be interposed between light emitting diode 13 and transmission path 18 to produce a signal pulse system which is applied as light to the base of transistor 19 to produce an output on emitter line 20 connected to the base of transistor 31 to produce an output signal on the emitter line 33 which drives the output logic 14. By proper selection of limiting resistor 17 the limiting resistor in the collector of transistor 19 may be eliminated.

Figure 5:
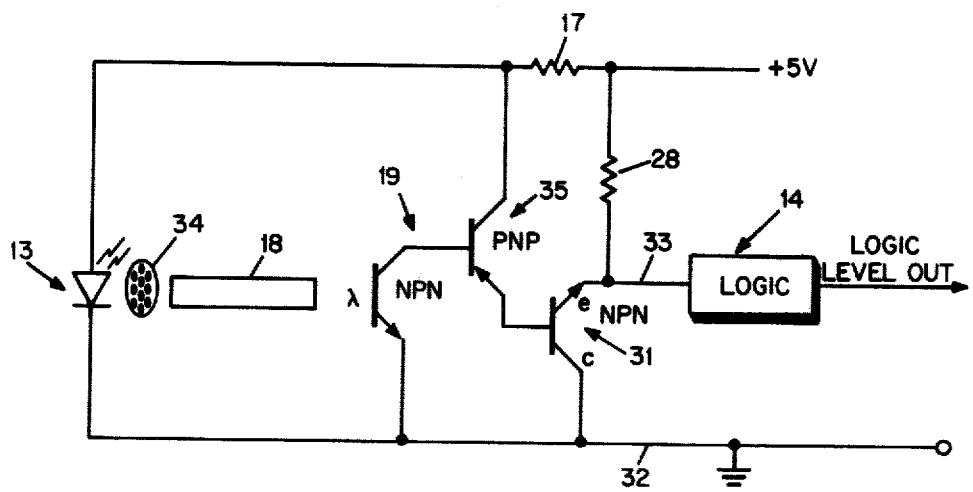
FIG. 5 is a schematic wiring diagram of a preferred embodiment optical amplifier similar to FIG. 3 but including two stages of amplification.

Refer now to FIG. 5 which shows a two stage amplifier embodying two reverse connected bipolar non-symmetrical transistors when higher gains are required than those shown in FIGS. 3 and 4. Typically, such a system is capable of producing gain ratios of slightly under 20 to 1. It will be appreciated that two stages of amplification may have gain ratios in excess of 20 to 1 and additional stages of amplifications can be employed for higher gain ratios while preserving the enhanced frequency response achieved by reverse connecting the bipolar non-symmetrical transistors between the reference and the voltage source. In FIG. 5 the light from light emitting diode 13 is processed by light interruptor 34 so that the light applied via transmission path 18 to the base of transistor 19 causes transistor 19 to conduct and pulls down the base of transistor 35 causing transistor 35 to conduct and push up the base of transistor 31 causing transistor 31 to conduct and generate an output signal on output line 33. It will be appreciated that transistor 35 is a PNP transistor which is reverse connected between the five volt source and the base of transistor 31 which has its collector connected to the reference 32 and the aformentioned transistor 31 is an NPN transistor which is reverse connected between the high voltage source and the reference 32. By reverse connecting the transistor 31 and 35, the base to emitter resistors which are normally required may be eliminated.

Having explained a preferred embodiment high frequency response low amplification amplifier for an optical detector system it will be appreciated that the problems of replacement of coaxial cables with fiber optic cables have been virtually eliminated. Amplifiers having low gain, low noise, low cost and capable of being miniaturized as integrated circuits are now available which will permit fiber optic cables to be connected over long lengths to high frequency response computer systems and peripheral systems.

I claim:

1. An amplifier for low amplification optical detector systems comprising:
    a source of light signals,
    a photo transistor having its input coupled to said source of light signals,
    a bipolar non-symmetrical transistor having its base coupled to the output of said photo transistor,
    a power source comprising a high level and a low level voltage,
    said photo transistor being coupled between said high level voltage and said bipolar non-symmetrical transistor without a feedback input, and
    said bipolar non-symmetrical transistor being reverse connected between said high level voltage and said low level voltage without a feedback output, whereby the response time of said bipolar non-symmetrical transistor is substantially increased and the gain is reduced without a feedback circuit.

2. An amplifier for low amplification optical detector systems as set forth in claim 1 wherein said bipolar nonsymmetrical transistor is an NPN transistor having a gain substantially in excess of 20 to 1 when the collector electrode is connected to said high level voltage of said power source, and
    said collector electrode being reverse connected to said low level voltage of said power source whereby the gain is reduced below 20 to 1 and the frequency response is substantially increased.

3. An amplifier for low amplification optical detector systems as set forth in claim 1 wherein said bipolar nonsymmetrical transistor is a PNP transistor having a gain substantially in excess of 20 to 1 when the emitter electrode is connected to said high level voltage of said power source, and
    said emitter electrode being reverse connected to said low level voltage of said power source whereby the gain is reduced below 20 to 1 and the frequency response is substantially increased.

4. An amplifier for low amplification optical detector systems as set forth in claim 1 wherein said source of light signals comprises:
    a light emitting diode adapted to be always on, and
    an interrupter system intermediate said light emitting diode and said photo transistor for generating said light signals.

5. An amplifier for low amplification optical detector systems as set forth in claim 1 wherein said source of light signals comprise:
    a light emitting diode coupled to said source of electrical pulses and adapted to be turned on by said electrical pulses.

6. An amplifier for low amplification optical detector systems as set forth in claim 1 which further includes,
    a second bipolar non-symmetrical transistor reverse connected between said high level voltage and said base of the first bipolar non-symmetrical transistor without a feedback output,
    the base of said second bipolar non-symmetrical transistor being coupled to the output of said photo transistor, whereby the combined amplification gain of said bipolar non-symmetrical transistors is below 20 to 1.

* * * * *